United States Patent [19]

Chen et al.

[11] Patent Number: 5,356,478
[45] Date of Patent: Oct. 18, 1994

[54] PLASMA CLEANING METHOD FOR REMOVING RESIDUES IN A PLASMA TREATMENT CHAMBER

[75] Inventors: Ching-Hwa Chen, Milpitas; David Arnett, Fremont; David Liu, San Jose, all of Calif.

[73] Assignee: LAM Research Corporation, Fremont, Calif.

[21] Appl. No.: 176,935

[22] Filed: Jan. 3, 1994

Related U.S. Application Data

[63] Continuation of Ser. No. 902,663, Jun. 22, 1992, abandoned.

[51] Int. Cl.$^5$ .............................................. B08B 7/00
[52] U.S. Cl. ................................... 134/1; 134/22.1; 156/345; 156/643
[58] Field of Search .................. 134/1, 22.1; 156/643, 156/345

[56] References Cited

U.S. PATENT DOCUMENTS

| | | | |
|---|---|---|---|
| 4,576,698 | 3/1986 | Gallagher et al. | 156/643 X |
| 4,749,440 | 6/1988 | Blackwood et al. | 156/646 |
| 4,786,352 | 11/1988 | Benzing | 156/345 |
| 4,786,360 | 11/1988 | Cote et al. | 156/643 |
| 4,816,113 | 3/1989 | Yamazaki | 156/643 |
| 4,975,146 | 12/1990 | Knapp et al. | 134/1 |
| 4,983,254 | 1/1991 | Fujimura et al. | 134/1 |
| 4,986,877 | 1/1991 | Tachi et al. | 156/643 |
| 5,022,958 | 6/1991 | Favreau et al. | 156/643 |
| 5,108,542 | 4/1992 | Lin | 156/643 |
| 5,110,408 | 5/1992 | Fujii et al. | 156/643 |
| 5,158,644 | 10/1992 | Cheung et al. | 134/1 |

FOREIGN PATENT DOCUMENTS

| | | | |
|---|---|---|---|
| 0201016 | 12/1982 | Japan | 134/1 |
| 0250185 | 11/1986 | Japan | . |
| 61-250185 | 11/1986 | Japan | . |
| 3-62520 | 3/1991 | Japan | . |
| 0362520 | 3/1991 | Japan | . |

*Primary Examiner*—Richard O. Dean
*Assistant Examiner*—Saeed Chaudhry
*Attorney, Agent, or Firm*—Burns, Doane, Swecker & Mathis

[57] ABSTRACT

A plasma cleaning method for removing residues previously formed in a plasma treatment chamber by dry etching layers such as photoresist, barriers, etc., on a wafer. The method includes introducing a cleaning gas mixture of an oxidizing gas and a chlorine containing gas into the chamber followed by performing a plasma cleaning step. The plasma cleaning step is performed by activating the cleaning gas mixture and forming a plasma cleaning gas, contacting interior surfaces of the chamber with the plasma cleaning gas and removing residues on the interior surfaces. The cleaning gas mixture can also include a fluorine-based gas. For instance, the cleaning gas can include $Cl_2$ and $O_2$ and optionally $CF_4$. An advantage of the cleaning method is that it is not necessary to open the plasma treatment chamber. Also, it is possible to completely remove all residues and prevent by-products formed during the cleaning step from remaining after the cleaning step.

22 Claims, No Drawings

PLASMA CLEANING METHOD FOR REMOVING RESIDUES IN A PLASMA TREATMENT CHAMBER

This application is a continuation of application Ser. No. 07/902,663, filed Jun. 22, 1992, now abandoned.

BACKGROUND OF THE INVENTION

1. Field of the Invention

The invention relates to a method of cleaning a vacuum treatment apparatus to remove previously deposited residues which have accumulated on interior surfaces of the apparatus. For instance, the method can be used to clean interior surfaces of a plasma chamber wherein specimens such as silicon wafers having one or more layers thereon are subjected to dry etching. In particular, the invention relates to plasma etching to remove residues on electrodes, interior walls, and other components located within a plasma treatment chamber.

2. Description of the Related Art

It is conventional to dry etch a stack of thin layers which can include a photoresist (for patterning the underlying layers), an anti-reflective coating (also known as an ARC layer, used for covering the surface of the underlying layers), aluminum (or an aluminum alloy), and a barrier material (such as metal, metal compound or silicide). For instance, U.S. Pat. No. 4,986,877 discloses dry etching of aluminum with $Cl_2$, polysilicon with $SF_6$, $SiO_2$ and $Si_3N_4$ with a fluorocarbon and photoresist with $O_2$. U.S. Pat. No. 5,022,958 discloses dry etching a dielectric with $CHF_3+Ar$, removing polymer with pure oxygen and further etching the dielectric with $CHF_3+Ar+CF_4$. Such etching, however, results in residues or deposits building up on surfaces inside the plasma treatment chamber.

When a film is dry etched in a chlorine-based plasma (or a sequence of chlorine-based and fluorine-based dry etches), residual reaction product (henceforth referred to as "residues") adhere upon surfaces in the plasma treatment chamber. These residues contain metals (or silicates, depending on which type of dry etch is used), chlorine, and organics (or compounds of the aforementioned materials). The surfaces that the residues adhere to include upper and lower electrode surfaces, walls of the plasma treatment chamber, clamping surfaces, and any other item with which the plasma or its by-products comes in contact. A build-up of these residues deteriorates the etch performance of the dry etch. As such, the presence of such residues is undesirable.

Japanese Laid-Open Patent Publication No. 61-250185 discloses a method of removing deposits such as $Si_xCl_y$ on components of a plasma etching device. The components include a high-frequency electrode and interior surfaces of the plasma reaction chamber. Such deposits are formed when aluminum on the wafer is dry etched by a plasma formed from $SiCl_4$. The deposits are removed by contacting the interior surfaces of the chamber with an oxidizing gas which oxidizes the deposits to form $SiO_2$. A plasma is then formed from a fluoride containing gas and the $SiO_2$ is removed. For instance, a gas containing moisture or hydrogen peroxide, ozone, etc., can be introduced in the form of a plasma to promote the reaction:

$$Si_xCl_y + H_2O \rightarrow mHCl(gas)\uparrow + SiO_2$$

Next, after evacuating the chamber, a gas containing fluorine such as $CF_4$ or $NF_3$, $SF_6$ or $NF_3+O_2$ or $SF_6+O_2$ can be introduced in the form of a plasma to promote the following reaction:

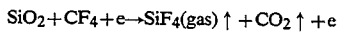

$$SiO_2 + CF_4 + e \rightarrow SiF_4(gas)\uparrow + CO_2\uparrow + e$$

Japanese Laid-Open Patent Publication No. 3-62520 discloses a method of using a plasma formed from chlorine and fluorine to remove a reaction product that remains after etching of an aluminum alloy film and after etching of a barrier metal. For instance, when an overlying aluminum layer such as an Al-Si-Cu, Al-Si or Al-Cu film is etched with chlorine and an underlying barrier layer such as TiW, MoSi, WSi, Ti, TiN or $\alpha$-Si is etched with fluorine, residual reaction products build up inside the plasma treatment chamber on parts such as electrodes after 10 wafers have been etched. To remove the deposits, a plasma is formed from a gas containing $Cl_2$ alone or $Cl_2+BCl_3$ or $Cl_2+HCl$ and cleaning is performed for 5 minutes. Then, a gas containing $SF_6$, SF or $C_2F_5$ is converted into plasma and cleaning is performed for 5 minutes. As a result, Al product and Ti product form $AlCl_2$ and $TiCl_2$ which is removed during $Cl_2$ plasma cleaning and W product forms $WF_5$ which is removed during $SF_6$ plasma cleaning.

U.S. Pat. No. 4,786,352 discloses a method of cleaning silicon oxide in a low pressure chemical vapor deposition (LPCVD) chamber using a cleaning gas which is decomposed to create etchant species in a plasma. The cleaning gases include $CF_4$, $CF_4+O_2$, $C_2F_6$, $SF_6$ or $NF_3$. Other cleaning gases include $CF_3Cl$, $CF_3Br$, $CCl_4$, $BCl_3$, $Cl_2$, HCl, $O_2$ and combinations with or without inert gases.

U.S. Pat. No. 4,576,698 discloses plasma cleaning of deposition products which build up in a deposition chamber wherein the cleaning gas is P.D. 100. U.S. Pat. No. 4,749,440 discloses a method of cleaning oxide deposits on quartz boats. U.S. Pat. No. 4,816,113 discloses a process of removing carbon deposits inside a chamber with oxygen plasma.

SUMMARY OF THE INVENTION

The invention provides a plasma cleaning method for removing metal-containing residues such as aluminum-containing residues in a plasma treatment chamber. The method includes introducing a cleaning gas mixture comprising an oxidizing gas and a chlorine containing gas into the chamber and performing a plasma cleaning step by activating the cleaning gas mixture and forming a plasma containing the cleaning gas, contacting interior surfaces of the chamber with the plasma cleaning gas and removing aluminum-containing residues on the interior surfaces. The cleaning gas can further comprise a fluorine-based gas.

The chlorine-based gas can comprise 10-25 % by volume of the cleaning gas. The fluorine-based gas can comprise 2-10% by volume of the cleaning gas. The chlorine-based gas can comprise $Cl_2$, $CCl_4$, HCl or mixture thereof. The fluorine-based gas can comprise $NF_3$, $SF_6$, a fluorocarbon or mixture thereof. The fluorocarbon can comprise $CF_4$, $C_2F_6$ or mixture thereof. The oxidizing gas is preferably $O_2$ and can contain $H_2O$, $H_2O_2$, $O_3$ or mixture thereof. The chlorine-based gas and the fluorine-based gas can comprise a chlorofluorocarbon gas.

The plasma cleaning gas can remove carbon of organic residues, metals, and metal oxides in the form of gas by-products. For instance, aluminum titanium and copper in the residues can be converted into a gaseous form via reaction with the chlorine in the plasma cleaning gas. Oxides and tungsten in the residues can be converted into a gaseous form via reaction with the fluorine of the plasma cleaning gas.

The process can consist of alternating steps of "high" and "low" pressures while generating the chamber cleaning plasma. These alternating steps can further be sequentially repeated to further enhance cleaning. For instance, the "high" pressure (relative to the processes normally run in the chamber) can be greater than 25 mTorr and the "low" pressure can be less than 25 mTorr. As a specific example, the high pressure can be at 40 mTorr and the low pressure can be at 10 mTorr.

As a result of this plasma cleaning procedure, the residues can be removed without opening the plasma treatment chamber. For instance, the cleaning step can be performed following a step of dry etching one or more layers on a wafer wherein the layers include a photoresist, metal film and oxide film and the dry etching causing residues to be deposited on interior surfaces of the plasma treatment chamber. In particular, the cleaning step can be performed after etching several hundred such wafers. For example, residues of a chlorine-based dry etching can be removed by the plasma cleaning gas without leaving by-products that will interfere with subsequent dry etching and without generating particles which would reduce a yield of a subsequent dry etch. In fact, residues can be completely removed from the interior surfaces of the plasma treatment chamber without by-products remaining in the plasma treatment chamber after the plasma cleaning step is terminated. For instance, by-products arising from the use of the cleaning plasma, such as $AlCl_3$, $CO$, $CO_2$, $Cl_2$, $CuCl$, and $WF_5$, can be removed from the plasma treatment chamber when the interior surfaces of the chamber are contacted with the plasma.

DETAILED DESCRIPTION OF THE PREFERRED EMBODIMENTS

The invention provides a new and improved method of removing residues from interior surfaces of a plasma treatment chamber. These residues are produced when multilayer structures are dry etched with plasma (such as by chlorine-based and/or fluorine-based plasmas) in the plasma treatment chamber. Such residues contain metals, silicates, chlorine, organics, and/or mixtures thereof. The method is particularly effective in cleaning the apparatus disclosed in commonly-owned U.S. Pat. No. 4,948,458 ("Ogle"), the subject matter of which is hereby incorporated by reference.

According to the invention, plasma formed from chlorine and an oxidizing gas is used to remove residues from the interior surfaces of a plasma treatment chamber. Because of the completeness of the reactions in converting the solid residues into gaseous form, it is possible to completely clean the plasma treatment chamber, that is, no by-products remain in the chamber.

The method according to the invention unexpectedly provides superior cleaning of chamber residues compared to sequential use of individual plasma cleaning gases. For instance, a plasma containing only a chlorine-based gas fails to completely remove residues left by dry etching a stack of thin layers such as those encountered in the manufacturing of a semiconductor device. Such layers typically include a barrier metal which can be etched by the addition of a fluorine-based gas. It should be noted that the dry etch residues are a product of a serial etching of some layers of materials such as various metal layers and the constant etching of others such as photoresist. As such, the residues are a complex combination of materials that a selective chlorine-based etch cannot remove.

A plasma containing only an oxidizing gas is ineffective in cleaning residue containing metals or silicates, such as aluminum. A plasma containing only a fluorine-based gas results in solid by-products such as $AlF_3$ that remain in the chamber. These by-products continue interfering with subsequent dry etching because of fluorine that would be freed during the dry etch. In addition, these by-products contribute to particulates that cause a yield loss in the product of the dry etch.

It has been unexpectedly discovered that a plasma formed from chlorine and an oxidizing gas with or without a fluorine containing gas is effective in completely removing residues in a plasma treatment chamber. On the other hand, if cleaning is performed sequentially with an oxidizing plasma, then a chlorine-based plasma followed by a fluorine-based plasma, each plasma is too selective in what is reacted and consequently, cannot remove residues that contain complex compounds of metals, chlorine, and/or organics. The same is true for different sequences of cleaning with such oxidizing, chlorine-based and fluorine-based gases. Furthermore, by using a sequence of etches based on the oxidizing, chlorine-based and fluorine-based gases, other by-products are formed which continue to interfere with dry etching and even produce particles that reduce the yield of the dry etch. According to the invention, however, it is possible to plasma clean a plasma treatment chamber and completely remove the residues left from previous dry etching without generating particles that would reduce the yield of the dry etch.

According to the invention, a plasma (or its reactive by-products) is introduced into an evacuated chamber (that was previously used for chlorine-based dry etching or chlorine and fluorine-based dry etching) so as to come into contact with the interior surfaces of the plasma treatment chamber and the products of the reaction with the residues are evacuated. The plasma used to clean the plasma treatment chamber includes an oxidizing gas (e.g., $O_2$) and a chlorine-based gas (e.g., $Cl_2$) or a gas mixture containing the oxidizing gas, the chlorine-based gas and a fluorine-based gas. As a result, the plasma liberates the carbon of the organics and metals such as Al or Cu are released into a gaseous form via reaction with the chlorine. Oxides and some metals such as W react with the fluorine to form other gas by-products. The chlorine and fluorine also provide catalytic assistance to the oxygen (via sputtering) so as to liberate the carbon of the organics. As all of these reactions take place simultaneously and assist each other, all material in the residues is consumed. Accordingly, the residues of the previous chlorine-based dry etching are removed without leaving products that would interfere with future dry etching and without generating particles that would reduce the yield of the dry etch.

The following example is given for purposes of further explaining aspects of the invention.

Example

In order to etch a multi-layer stack (such as an overlying layer of photoresists for patterning, Ti for the ARC, aluminum with copper and TiW), it is conventional to perform at least a two etching step process. In particular, the Ti and Al are etched with a chlorine-based dry etch and then the TiW is etched with a fluorine-based dry etch. When several hundred wafers are dry etched, residues from these etches coat the surfaces of the chamber, accumulating to a significant thickness which adversely affects subsequent dry etching of such wafers. In accordance with the invention, these residues can be removed by using the following gas mixtures:

$$O_2 + Cl_2 \text{(gas volume ratio 20:4)} \quad (1)$$

$$O_2Cl_2CF_4 \text{gas volume ratio 20:4:1)} \quad (2)$$

The cleaning process according to the invention can be run at a high pressure (e.g., a pressure greater than 25 mTorr such as 40 mTorr) and then at a low pressure (e.g., a pressure lower than 25 mTorr such as 10 mTorr), each step being performed for about 15 minutes. These "high" and "low" pressures are relative to the normal operating range of the dry etches performed in the chamber. The residues, containing metals, chlorine, fluorine and organics are thus removed via by-products such as $AlCl_3CO$, $CO_2$, $Cl_2$, $CuCl$ and $WF_5$. Due to the completeness of the reactions in converting the solid residues into gaseous form, no by-products remain in the chamber after the cleaning step.

In the case where the cleaning plasma includes an oxidizing gas and a chlorine-based gas, the chlorine-based gas can be present in the amount of 10–25 % by volume. In the case where the cleaning gas includes an oxidizing gas, a chlorine-based gas and a fluorine-based gas, the chlorine-based gas can be present in the amount of 10–25 % by volume and the fluorine-based gas can be present in the amount of 2–10% by volume. The oxidizing gas can also contain $H_2O$, $H_2O_2$, $O_3$ and/or mixtures thereof. The chlorine-based gas can comprise $Cl_2$, $CCl_4$, $HCl$ and/or mixtures thereof. The fluorine-based gas can comprise $NF_3$, $SF_6$, a fluorocarbon such as $CF_4$ or $C_2F_6$ and/or combinations thereof. In either case, the molecules themselves, a combination, or the dissociated ions and radicals thereof may be incorporated into the oxidizing, the chlorine-based and/or the fluorine-based gas. The chlorine-based and fluorine-based gases can be replaced or supplemented by a chlorocarbon gas (also known as a CFC).

While the invention has been described with reference to the foregoing embodiments, various changes and modifications can be made thereto within the scope of the appended claims.

What is claimed is:

1. A plasma cleaning method for removing aluminum-containing residues in a plasma treatment chamber, comprising:
   introducing a cleaning gas mixture comprising oxygen gas and a chlorine containing gas into a plasma treatment chamber; and
   performing a plasma cleaning step by activating the cleaning gas mixture and forming a plasma with the cleaning gas, contacting interior surfaces of the plasma treatment chamber with the plasma cleaning gas and removing aluminum-containing residues on the interior surfaces.

2. The method of claim 1, wherein the cleaning gas mixture further comprises a fluorine-based gas.

3. The method of claim 1, wherein the chlorine-based gas comprises 10–25 % by volume of the cleaning gas.

4. The method of claim 2, wherein the fluorine-based gas comprises 2–10% by volume of the cleaning gas.

5. The method of claim 1, wherein the chlorine-based gas comprises $Cl_2$, $CCl_4$, $HCl$ or mixtures thereof.

6. The method of claim 2, wherein the fluorine-based gas comprises $NF_3$, $SF_6$, a fluorocarbon or mixture thereof.

7. The method of claim 6, wherein the fluorocarbon comprises $CF_4$, $C_2F_6$ or mixture thereof.

8. The method of claim 1, wherein the cleaning gas further contains $H_2O$, $H_2O_2$, $O_3$ or mixture thereof.

9. The method of claim 2, wherein the chlorine-based gas and the fluorine-based gas comprise a chlorofluorocarbon gas.

10. The method of claim 1, wherein the plasma cleaning gas removes carbon of organic residues, metals, and metal oxides in the form of gas by-products.

11. The method of claim 1, wherein at least one of aluminum and copper in the residues is converted into a gaseous form via reaction with the chlorine in the plasma cleaning gas.

12. The method of claim 2, wherein at least one of oxides and tungsten in the residues is converted into a gaseous form via reaction with the fluorine of the plasma cleaning gas.

13. The method of claim 1, wherein the plasma treatment chamber is evacuated during the cleaning step.

14. The method of claim 13, wherein during the cleaning step an interior of the plasma treatment chamber is initially at a high pressure and then at a low pressure, the high pressure being greater than 25 mTorr and the low pressure being less than 25 mTorr.

15. The method of claim 14, wherein the high pressure is around 40 mTorr and the low pressure is around 10 mTorr.

16. The method of claim 1, wherein at least one by-product selected from the group consisting of $AlCl_3$, $CO$, $CO_2$, $Cl_2$, $CuCl$, and $WF_5$ is removed from the plasma treatment chamber when the interior surfaces of the chamber are contacted with the plasma cleaning gas.

17. The method of claim 1, wherein the residues are removed without opening the plasma treatment chamber.

18. The method of claim 1, further comprising a step of dry etching one or more layers on at least one wafer prior to the plasma cleaning step, the layers including at least one of a photoresist, metal film and oxide film, the dry etching causing residues to be deposited on interior surfaces of the plasma treatment chamber.

19. The method of claim 18, wherein the dry etch comprises a chlorine-based dry etch and residues of the chlorine-based dry etch are removed by the plasma cleaning gas without leaving by-products that will interfere with a dry etch performed after the plasma cleaning step and without generating particles which would reduce a yield of a subsequent dry etch.

20. The method of claim 1, wherein the residues are completely removed from the interior surfaces of the plasma treatment chamber and no by-products remain in the plasma treatment chamber after the plasma cleaning step is terminated.

21. A plasma cleaning method for removing metal-containing residues in a plasma treatment chamber, comprising:
   introducing a cleaning gas mixture comprising oxygen gas and a chlorine containing gas into a plasma treatment chamber; and
   performing a plasma cleaning step by activating the cleaning gas mixture and forming a plasma with the cleaning gas, contacting interior surfaces of the plasma treatment chamber with the plasma cleaning gas and removing metal-containing residues on the interior surfaces.

22. The method of claim 21, wherein the metal-residues include aluminum, titanium, copper, tungsten or mixture thereof.

* * * * *